US011686998B2

(12) United States Patent
Seo

(10) Patent No.: US 11,686,998 B2
(45) Date of Patent: Jun. 27, 2023

(54) METHOD FOR MANUFACTURING A SEMICONDUCTOR DEVICE

(71) Applicant: Samsung Electronics Co., Ltd., Suwon-si (KR)

(72) Inventor: Jeong-Hun Seo, Seongnam-si (KR)

(73) Assignee: Samsung Electronics Co., Ltd.

( * ) Notice: Subject to any disclaimer, the term of this patent is extended or adjusted under 35 U.S.C. 154(b) by 214 days.

(21) Appl. No.: 17/178,676

(22) Filed: Feb. 18, 2021

(65) Prior Publication Data

US 2021/0173300 A1 Jun. 10, 2021

Related U.S. Application Data

(62) Division of application No. 16/223,175, filed on Dec. 18, 2018, now Pat. No. 10,955,742.

(30) Foreign Application Priority Data

Jun. 15, 2018 (KR) .......................... 10-2018-0069207

(51) Int. Cl.
G03F 1/84 (2012.01)
G03F 1/36 (2012.01)
G06T 7/00 (2017.01)
G01N 21/956 (2006.01)

(52) U.S. Cl.
CPC .................. *G03F 1/84* (2013.01); *G03F 1/36* (2013.01); *G06T 7/001* (2013.01); *G06T 7/0006* (2013.01); *G06T 7/97* (2017.01); *G01N 21/956* (2013.01); *G06T 2207/30148* (2013.01)

(58) Field of Classification Search
CPC ......... G06T 7/97; G06T 7/0006; G06T 7/001; G06T 2207/30148; G03F 1/36; G03F 1/84; G01N 21/956
See application file for complete search history.

(56) References Cited

U.S. PATENT DOCUMENTS

| | | | |
|---|---|---|---|
| 7,136,191 B2 | 11/2006 | Kaltenbach et al. | |
| 7,152,219 B2 | 12/2006 | Pang | |
| 8,581,976 B2 | 11/2013 | Kurihara et al. | |
| 9,177,372 B2 | 11/2015 | Tsuchiya et al. | |
| 9,188,554 B2 | 11/2015 | Shishido et al. | |

(Continued)

FOREIGN PATENT DOCUMENTS

JP 4516253 B2 8/2010
KR 101623134 B1 5/2016

*Primary Examiner* — Kenny A Cese
(74) *Attorney, Agent, or Firm* — Myers Bigel, P.A.

(57) ABSTRACT

A method for manufacturing a semiconductor device includes designing a layout, manufacturing a photomask based on the designed layout, and performing a photolithography process using the photomask to form a pattern on a substrate. The manufacturing of the photomask includes preparing the photomask including first and second chip regions, extracting first and second images from the first and second chip regions, respectively, averaging the first and second images to generate a preliminary standard image including a difference region between the first and second images, inserting a normal image into the difference region based on the layout to generate a standard image, and comparing each of the first and second images with the standard image to detect a defect of the first and/or second chip regions.

14 Claims, 14 Drawing Sheets

(56) References Cited

U.S. PATENT DOCUMENTS

| | | |
|---|---|---|
| 9,715,725 B2 | 7/2017 | Zhang et al. |
| 2007/0031025 A1* | 2/2007 | Lim ........................ G06T 7/001 |
| | | 382/149 |
| 2009/0074286 A1 | 3/2009 | Kitazawa et al. |
| 2016/0290934 A1 | 10/2016 | Wells et al. |
| 2016/0314575 A1 | 10/2016 | Matsuo et al. |
| 2018/0144442 A1 | 5/2018 | Brauer |
| 2019/0066292 A1* | 2/2019 | Pomeranz ............. G06T 7/0004 |

* cited by examiner

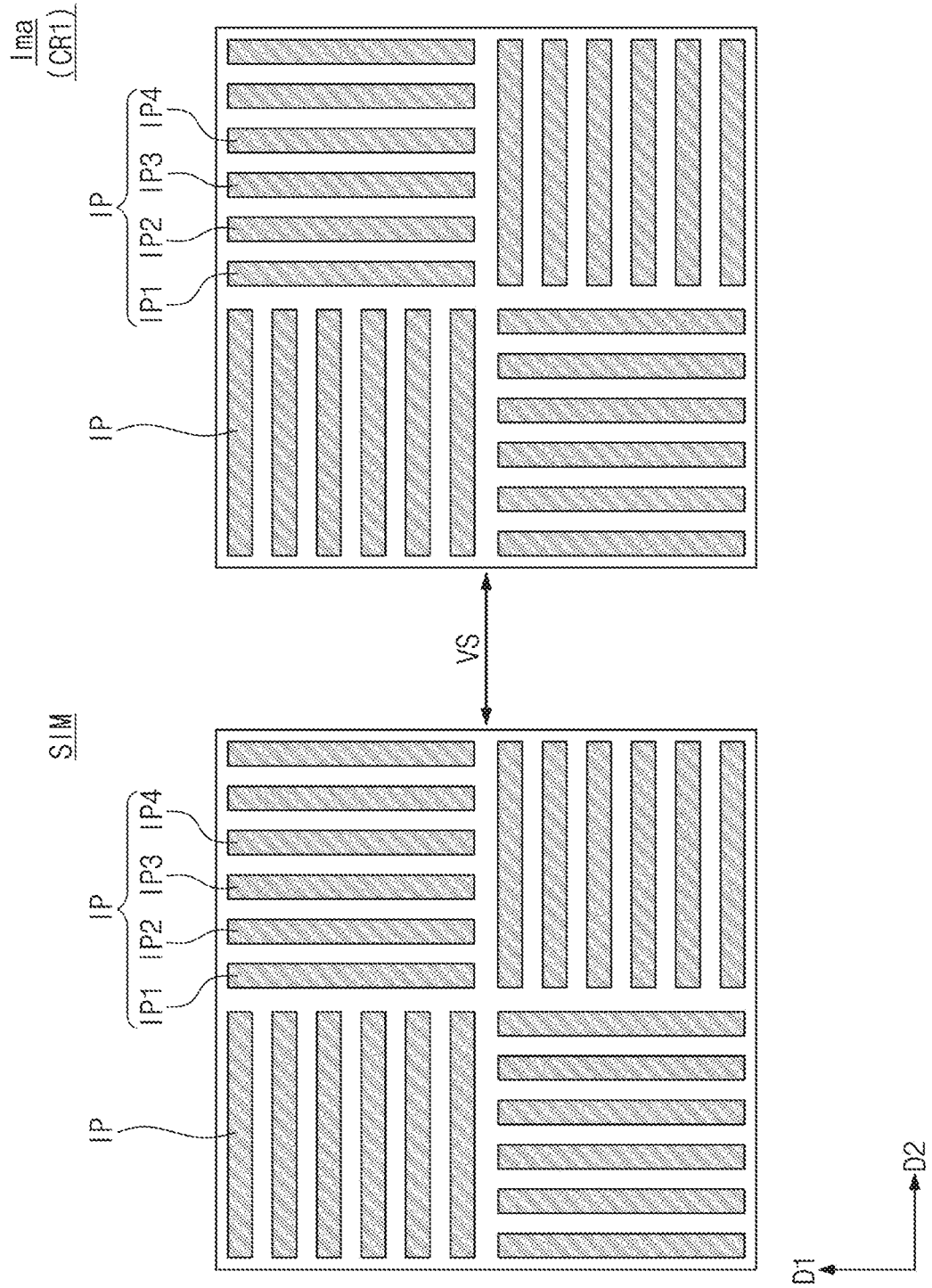

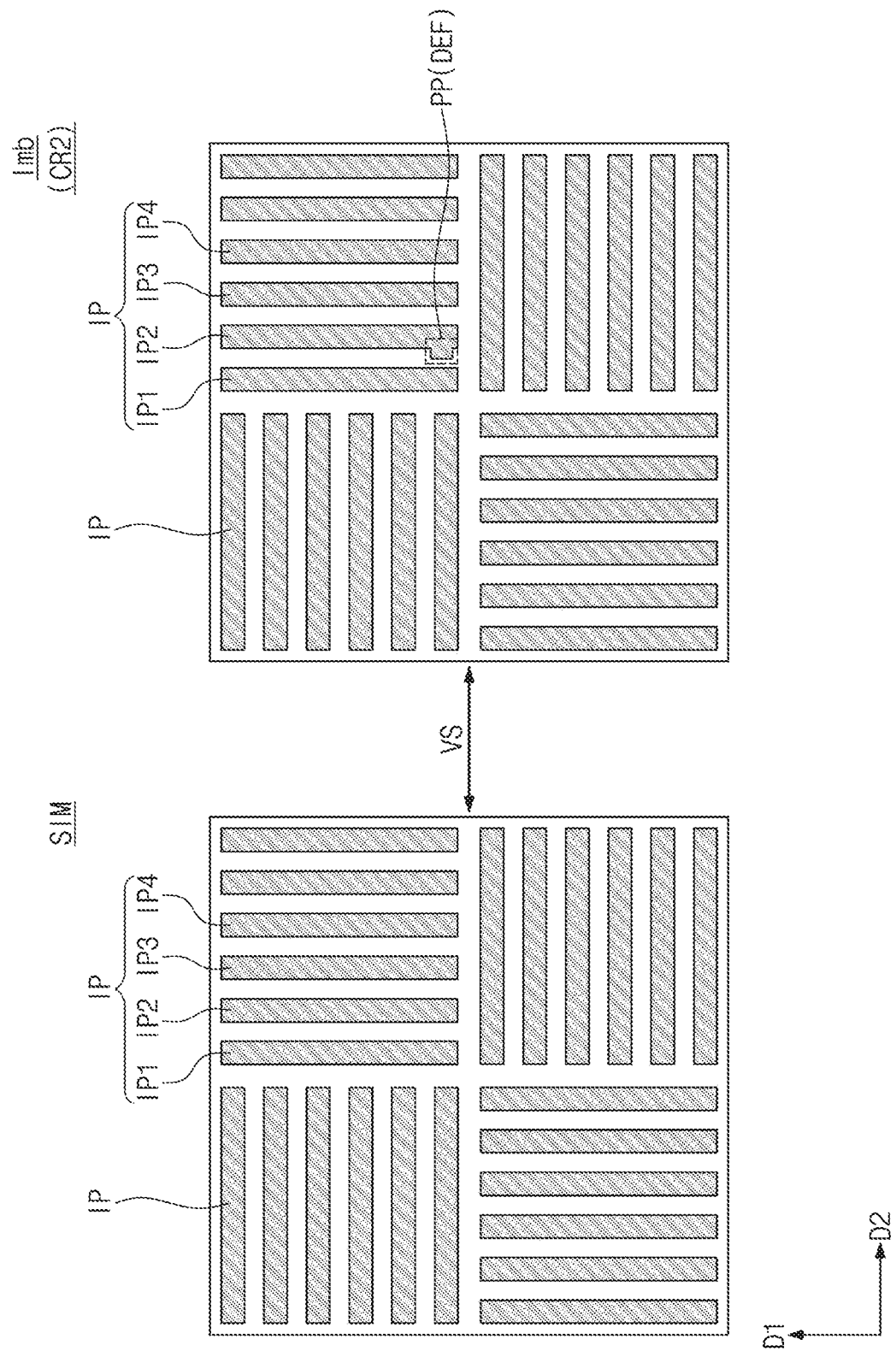

METHOD FOR MANUFACTURING A SEMICONDUCTOR DEVICE

CROSS-REFERENCE TO RELATED APPLICATION

This U.S. non-provisional patent application is a divisional of U.S. application Ser. No. 16/223,175, filed on Dec. 18, 2018, which claims priority under 35 U.S.C. § 119 to Korean Patent Application No. 10-2018-0069207, filed on Jun. 15, 2018, in the Korean Intellectual Property Office, the disclosures of which are hereby incorporated by reference in their entireties.

FIELD

Embodiments of the inventive concepts relate to methods for manufacturing semiconductor devices and, more particularly, to methods for manufacturing semiconductor devices including methods of inspecting a photomask.

BACKGROUND

Semiconductor devices are widely used in the electronics industry because of their small sizes, multi-functional characteristics, and/or low manufacture costs. Semiconductor devices may be categorized as semiconductor memory devices configured to store logical data, semiconductor logic devices configured to process logical data, or hybrid semiconductor devices having functions of both semiconductor memory devices and semiconductor logic devices. Semiconductor devices with improved characteristics may be increasingly demanded with the development of the electronics industry. For example, high-reliability, high-speed and/or multi-functional semiconductor devices may be increasingly demanded. To satisfy these demands, semiconductor devices may be more highly integrated and structures of semiconductor devices may become more and more complex.

SUMMARY

Embodiments of the inventive concepts may provide methods for manufacturing semiconductor devices that can more efficiently inspect defects of a photomask.

In an aspect, a method for manufacturing a semiconductor device may include designing a layout, manufacturing a photomask based on the designed layout, and performing a photolithography process using the manufactured photomask to form a pattern on a substrate. The manufacturing of the photomask may include preparing the photomask including a first chip region and a second chip region, extracting a first image and a second image from the first chip region and the second chip region, respectively, averaging the first and second images to form or generate a preliminary standard image including a difference region between the first and second images, inserting a normal image into the difference region based on the layout to form or generate a standard image, and comparing each of the first and second images with the standard image to detect a defect in at least one of the first or second chip regions.

In an aspect, a method for manufacturing a semiconductor device may include designing a layout, manufacturing a photomask based on the designed layout, inspecting the manufactured photomask, and performing a photolithography process using the photomask to form a pattern on a substrate. The inspecting of the photomask may include extracting a first image and a second image from a first chip region and a second chip region of the photomask, respectively, averaging the first and second images to form or generate a preliminary standard image including a blank region, extracting a region of the preliminary standard image as a patch, and inserting the extracted patch into the blank region to form or generate a standard image.

In an aspect, a method for manufacturing a semiconductor device may include designing a layout including a first layout pattern and a second layout pattern having the same shape and size as the first layout pattern, manufacturing a photomask including a first chip region and a second chip region based on the designed layout, each of the first and second chip regions including first and second mask patterns formed by the first and second layout patterns, respectively, inspecting the manufactured photomask, and performing a photolithography process using the photomask to form a pattern on a substrate. The inspecting of the photomask may include extracting first and second images from the first and second chip regions, respectively, each of the first and second images including first and second image patterns corresponding to the first and second mask patterns, respectively, averaging the first and second images to form or generate a preliminary standard image including a difference region on the first image pattern, extracting a patch corresponding to a region on the second image pattern of the preliminary standard image, and inserting the extracted patch into the difference region to form or generate a standard image.

BRIEF DESCRIPTION OF THE DRAWINGS

Embodiments of the inventive concepts will become more apparent in view of the attached drawings and accompanying detailed description.

FIG. 13 is a plan view illustrating operations for comparing the standard image with the first image.

FIG. 14 is a plan view illustrating operations for comparing the standard image with the second image.

DETAILED DESCRIPTION OF EMBODIMENTS

Figure 1:
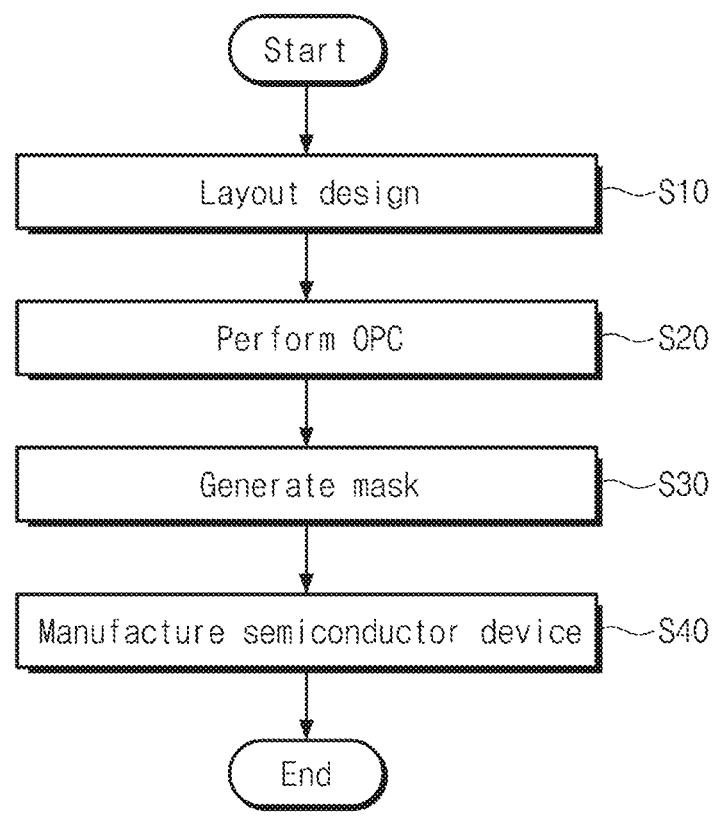
FIG. 1 is a flowchart illustrating methods for designing and manufacturing semiconductor devices, according to some embodiments of the inventive concepts.

FIG. 1 is a flowchart illustrating methods for designing and manufacturing semiconductor devices, according to some embodiments of the inventive concepts.

Referring to FIG. 1, a layout design process for realizing a semiconductor integrated circuit on a silicon substrate may be performed (S10, a first operation). The terms first, second, third, etc. are used herein merely to distinguish or differentiate one element, block, operation, etc. from another. As used herein, the term "and/or" includes any and all combinations of one or more of the associated listed items. The layout design process may include processes of placing and routing (e.g., connecting) various standard cells that are provided from a cell library based on a predetermined design rule.

The cell library for the layout design process may also include information on operations, speeds, and/or power consumption of the standard cells. In certain embodiments, the cell library for representing a layout of a circuit having a specific gate level may be defined in multiple or most of layout design tools. The layout design process may define or describe shapes and/or sizes of patterns for constituting or defining transistors and metal interconnection lines which will be actually formed on a silicon substrate. For example, layout patterns (e.g., PMOS, NMOS, N-WELL, gate electrodes, and metal interconnection lines to be disposed thereon) may be suitably placed to actually form an inverter circuit on a silicon substrate. For this, first, suitable one of inverters defined in advance in the cell library may be searched and selected.

The routing process may be performed on the placed standard cells. In detail, the routing process may be performed on the placed standard cells to connect them to upper interconnection lines. By the routing process, the standard cells may be electrically connected to each other to meet or otherwise according to a design. These processes may be automatically or manually performed by the layout design tool. In certain embodiments, the processes of placing and routing the standard cells may be automatically performed by an additional place & routing tool.

After the routing process, a verification process may be performed on the layout to verify whether there is a portion violating the design rule. In some embodiments, the verification process may include various verification items, such as a design rule check (DRC) item, an electrical rule check (ERC) item, and a layout vs schematic (LVS) item. The DRC item may be performed to check whether the layout suitably meets the design rule. The ERC item may be performed to check whether there is an issue of electrical disconnection in the layout. The LVS item may be performed to check whether the layout is prepared to coincide with the gate-level netlist.

An optical proximity correction (OPC) process may be performed (S20, a second operation). The layout patterns obtained by the layout design process may be realized on a silicon substrate by using a photolithography process. The OPC process may be performed to correct an optical proximity effect which may occur in the photolithography process. The optical proximity effect may be an unintended optical effect (such as refraction or diffraction) which may occur in the photolithography process. In other words, a distortion phenomenon of layout patterns, which may be caused by the optical proximity effect, may be corrected by the OPC process. The shapes and positions of the designed layout patterns may be slightly modified or biased by the OPC process.

A photomask may be generated based on the layout modified or biased by the OPC process (S30, a third operation). A chromium layer coated on a mask substrate (e.g., a glass substrate) may be patterned using the layout patterns to form mask patterns on the mask substrate. Thus, the photomask may be generated or manufactured.

A semiconductor device may be manufactured using the generated photomask (S40, a fourth operation). The shapes of the patterns obtained by the layout design process may be sequentially formed on a silicon substrate by photolithography processes using the generated photomasks.

Figure 2:
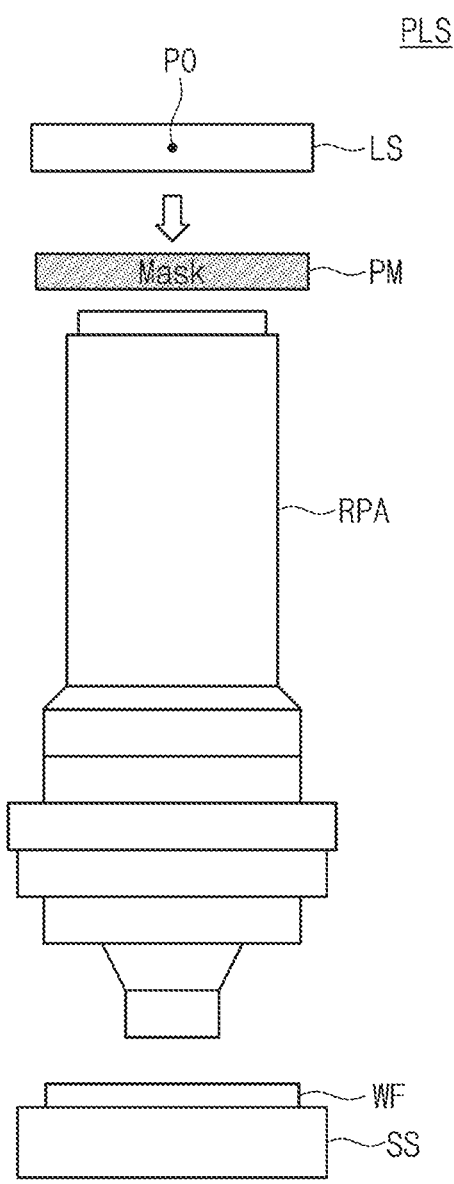
FIG. 2 is a conceptual view illustrating a photolithography system using photomasks manufactured according to some embodiments of the inventive concepts.

FIG. 2 is a conceptual view illustrating a photolithography system using a photomask manufactured according to some embodiments of the inventive concepts.

Referring to FIG. 2, a photolithography system PLS may include a light source LS, a photomask PM, a reduction projection apparatus RPA, and a substrate stage SS. The photomask PM may be generated or manufactured through the first to third operations S10, S20 and S30 described above with reference to FIG. 1. The photolithography system PLS may further include components in addition to those shown in FIG. 2. For example, the photolithography system PLS may further include a sensor used to measure a height and a gradient of a surface of a substrate WF.

The light source LS may emit light. The light emitted from the light source LS may be irradiated or provided to the photomask PM. In some embodiments, a lens may be provided between the light source LS and the photomask PM to adjust a focus of the light. The light source LS may include an ultraviolet light source (e.g., a krypton fluoride (KrF) light source having a wavelength of about 234 nm or an argon fluoride (ArF) light source having a wavelength of about 193 nm). The light source LS may include a single point light source PO. However, embodiments of the inventive concepts are not limited thereto. In certain embodiments, the light source LS may include a plurality of point light sources.

The photomask PM may include mask patterns to print (or realize) the designed layout onto the substrate WF. For example, the mask patterns may block the light emitted from the light source LS, and regions on which the mask patterns are not formed may transmit the light emitted from the light source LS.

The reduction projection apparatus RPA may receive the light transmitted through the photomask PM. The reduction projection apparatus RPA may match the layout patterns, to be printed onto the substrate WF, with the mask patterns of the photomask PM. The substrate stage SS may support the substrate WF. For example, the substrate WF may include a silicon wafer.

The reduction projection apparatus RPA may include an aperture. The aperture may be used to increase a depth of a focus of ultraviolet light emitted from the light source LS. For example, the aperture may include a dipole aperture or a quadruple aperture. The reduction projection apparatus RPA may further include a lens for adjusting a focus of light.

The light transmitted through the photomask PM may be irradiated to the substrate WF through the reduction projection apparatus RPA. Thus, resist patterns corresponding to the mask patterns of the photomask PM may be printed on the substrate WF.

Figure 3:
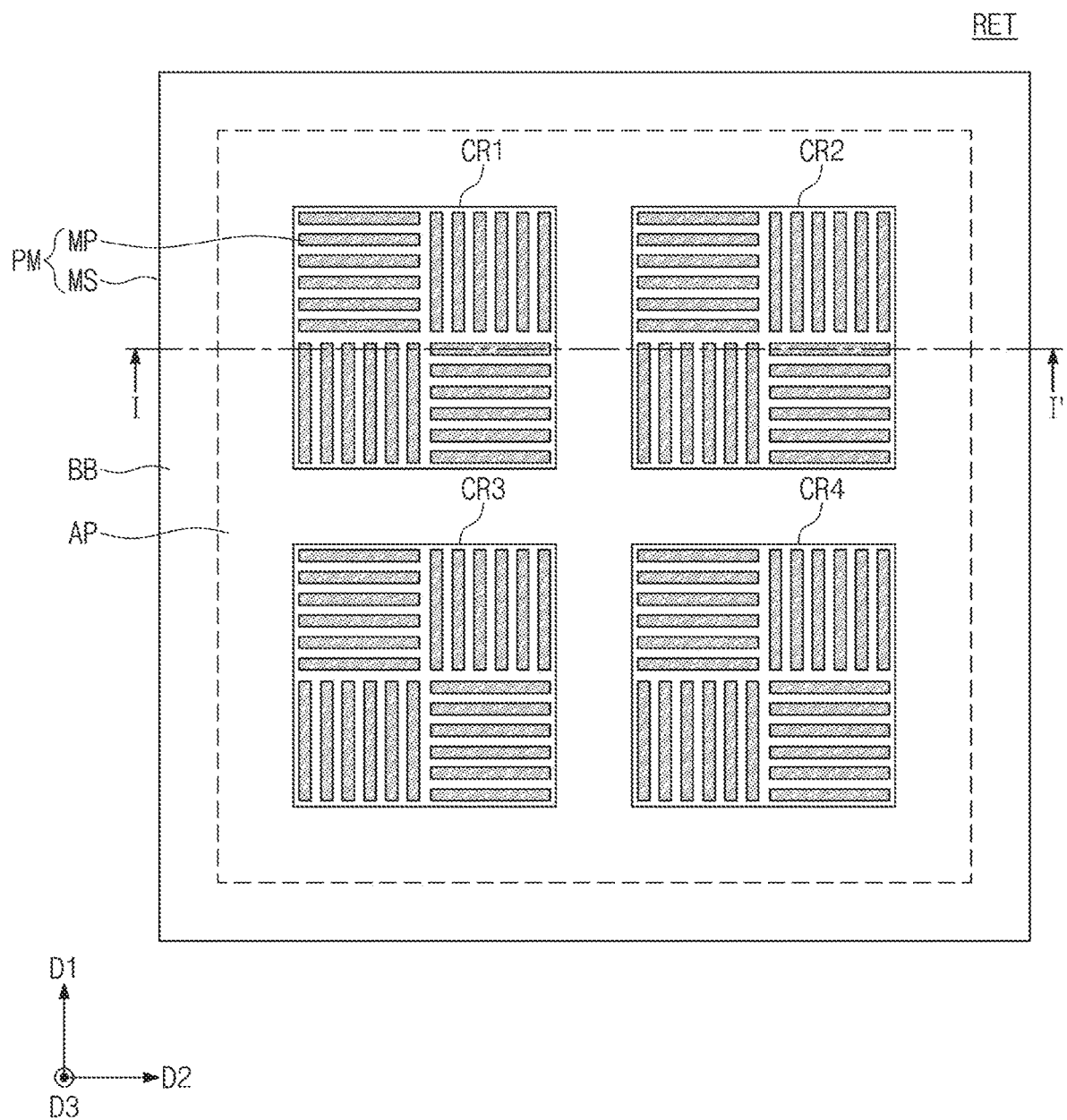
FIG. 3 is a plan view illustrating a reticle according to some embodiments of the inventive concepts.
Figure 4:
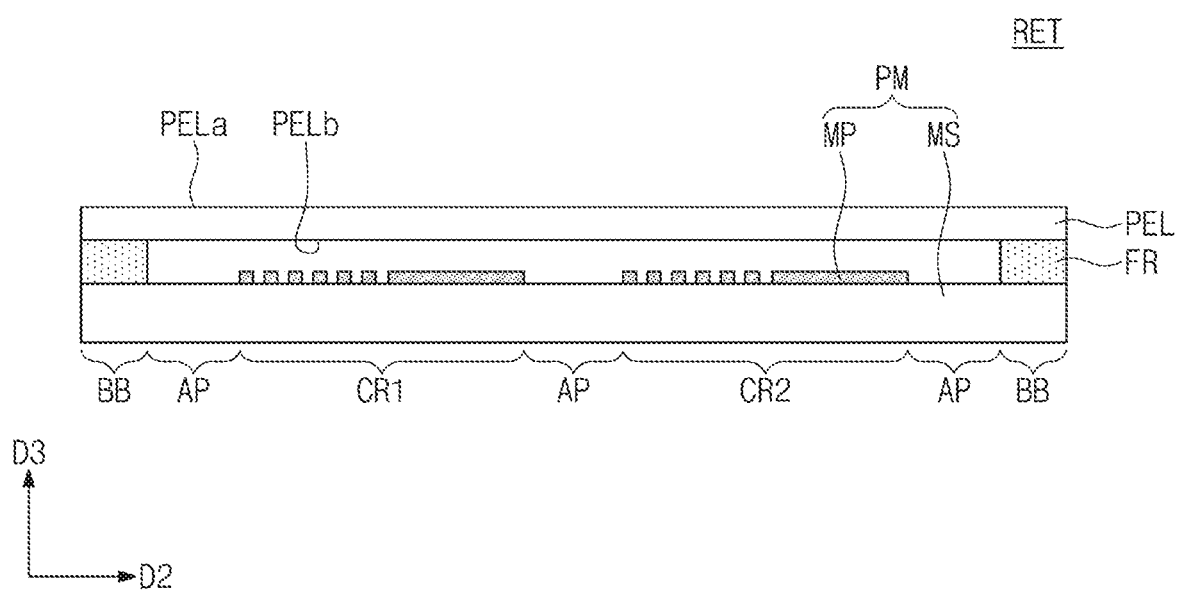
FIG. 4 is a cross-sectional view taken along a line I-I' of FIG. 3.

FIG. 3 is a plan view illustrating a reticle according to some embodiments of the inventive concepts. FIG. 4 is a cross-sectional view taken along a line I-I' of FIG. 3.

Referring to FIGS. 2, 3 and 4, a reticle RET may include the photomask PM, a pellicle PEL for protecting the photomask PM, and a frame FR between the photomask PM and the pellicle PEL. The reticle RET including the photomask PM according to the present embodiment may be installed in the photolithography system PLS of FIG. 2, and thus a photolithography process may be performed on the substrate WF.

The photomask PM may include a mask substrate MS and mask patterns MP on the mask substrate MS. The mask substrate MS may include first to fourth chip regions CR1 to CR4 for forming resist patterns on the substrate WF. The mask patterns MP may be disposed on the first to fourth chip regions CR1 to CR4. For example, the mask patterns MP may include a plurality of first mask patterns extending in a first direction D1 and a plurality of second mask patterns extending in a second direction D2. Shapes, sizes and distances of the mask patterns MP of FIGS. 3 and 4 are illustrated as an example and may be variously modified.

The first to fourth chip regions CR1 to CR4 may be substantially the same as each other. Resist patterns may be formed on first to fourth dies of the substrate WF through the first to fourth chip regions CR1 to CR4. In other words, each of the first to fourth chip regions CR1 to CR4 may correspond to one die of the substrate WF.

The mask substrate MS may further include an auxiliary pattern region AP surrounding each of the first to fourth chip regions CR1 to CR4, and a black border region BB located at the periphery of the mask substrate MS.

An auxiliary pattern which is not included in patterns constituting or defining a desired integrated circuit may be disposed on the auxiliary pattern region AP. The auxiliary pattern may include a pattern (e.g., an alignment key pattern) which may be necessary in processes of manufacturing the integrated circuit but does not remain in a final semiconductor chip. The auxiliary pattern region AP may correspond to a scribe lane region of the substrate WF, and thus the auxiliary pattern of the auxiliary pattern region AP may be transferred onto the scribe lane region of the substrate WF.

The black border region BB may be a non-pattern region on which a pattern to be transferred onto the substrate WF is not disposed.

A first surface PELa of the pellicle PEL may be exposed to the outside (e.g., may face away from or external to the photomask PM). A second surface PELb of the pellicle PEL may face the photomask PM. The frame FR may be disposed between the pellicle PEL and the photomask PM. The pellicle PEL may be spaced apart from the photomask PM by the frame FR. The frame FR may be provided on the black border region BB of the mask substrate MS. An adhesive layer may be disposed between the pellicle PEL and the frame FR. In addition, an adhesive layer may be disposed between the frame FR and the mask substrate MS.

The pellicle PEL may protect the photomask PM from external contaminants (e.g., dust and/or resist). If the pellicle PEL does not exist on the photomask PM, the external contaminants may adhere to the photomask PM and may cause various defects in a photolithography process.

Figure 5:
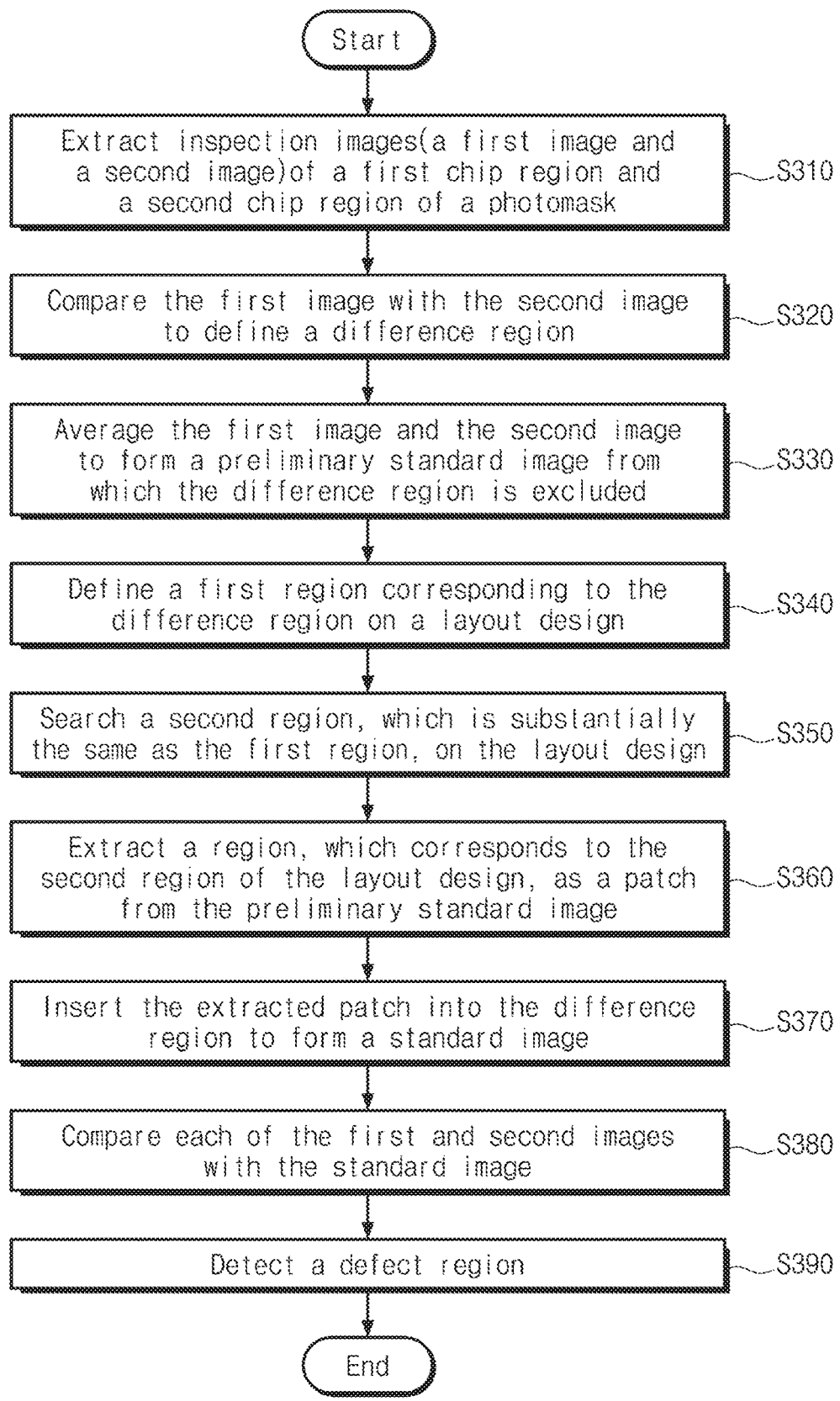
FIG. 5 is a flowchart illustrating methods of detecting defects of a photomask.
Figure 6:
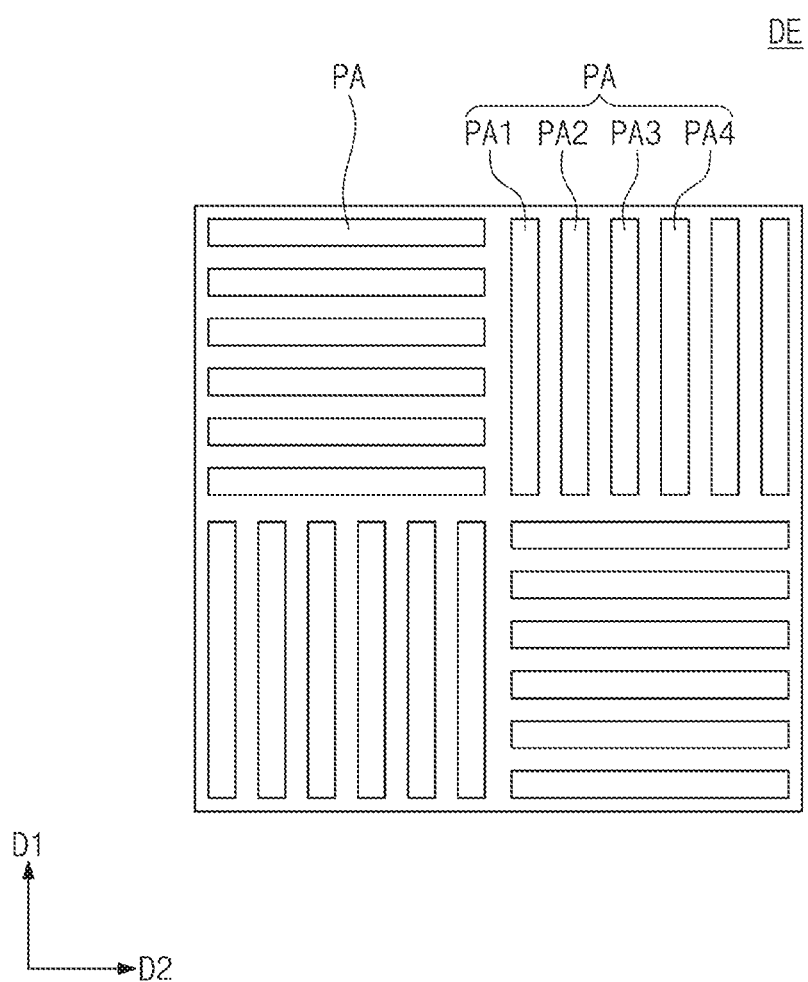
FIG. 6 illustrates a layout design for of manufacturing a photomask.

FIG. 5 is a flowchart illustrating methods of detecting defects of a photomask. FIG. 6 illustrates a layout design which forms a basis of manufacturing a photomask.

Referring to FIGS. 1, 3, 5 and 6, a layout design DE may be obtained by performing the layout design process (S10) and the OPC process (S20) of FIG. 1. The layout design DE may include layout patterns PA. In an embodiment, the layout patterns PA may include first to fourth layout patterns PA1 to PA4 extending in the first direction D1 in parallel to each other.

The operation S30 of generating the photomask PM of FIG. 3 may include manufacturing the photomask PM based on the layout design DE, inspecting or detecting whether defects exists on the first to fourth chip regions CR1 to CR4 of the manufactured photomask PM, and correcting the detected defect.

In detail, each of the first to fourth chip regions CR1 to CR4 of the photomask PM may be formed based on the layout design DE. Next, the operation of inspecting or detecting defects of the first to fourth chip regions CR1 to CR4 of the photomask PM may be performed. The operation of inspecting the defect may be performed as shown in the flowchart of FIG. 5.

Figure 7:
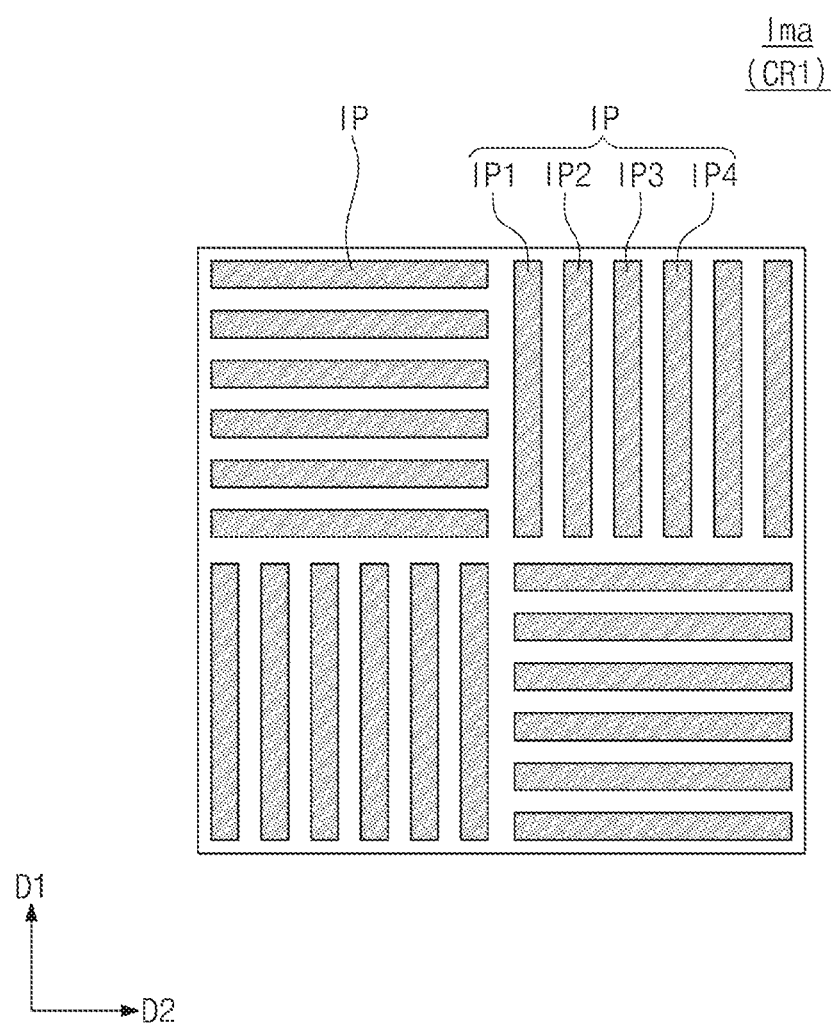
FIG. 7 illustrates an optical image of a first chip region of the photomask of FIG. 3.
Figure 8:
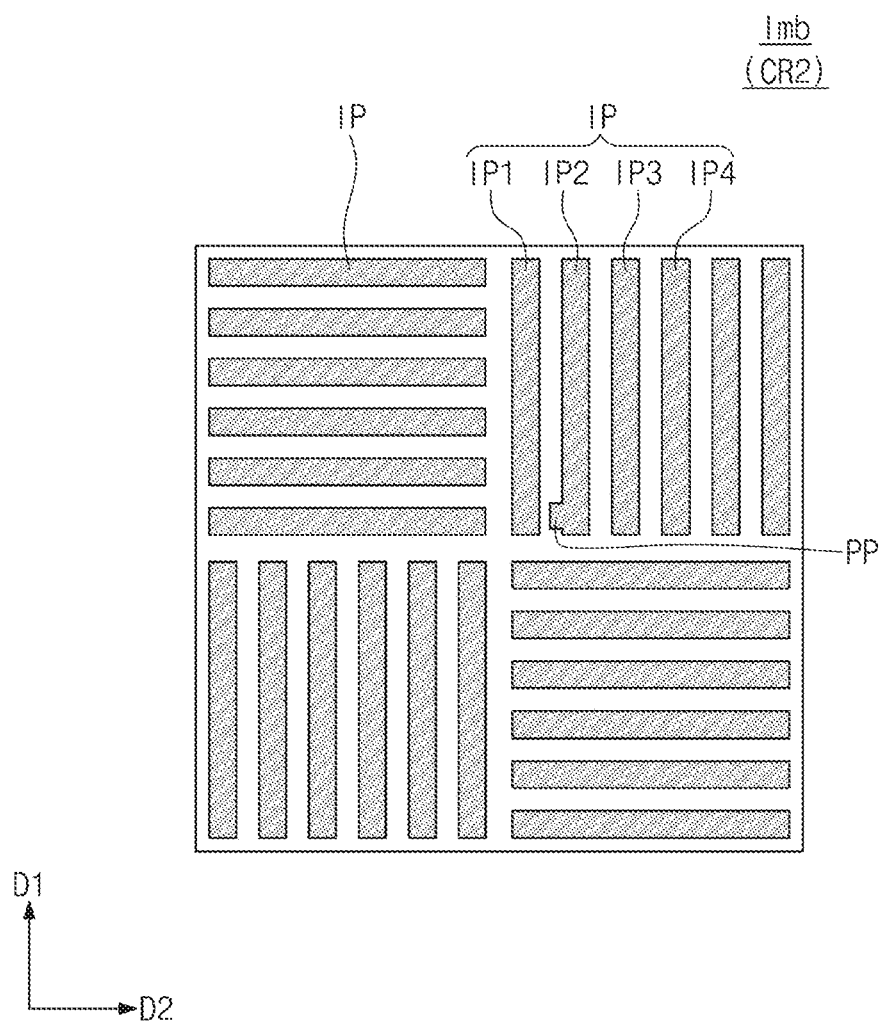
FIG. 8 illustrates an optical image of a second chip region of the photomask of FIG. 3.

FIG. 7 illustrates an optical image of a first chip region of a photomask of FIG. 3. FIG. 8 illustrates an optical image of a second chip region of the photomask of FIG. 3. Referring to FIGS. 5, 7 and 8, inspection images of the first chip region CR1 and the second chip region CR2 of the photomask PM may be acquired or extracted (S310). The extraction of the inspection images may be performed by a photomask inspecting apparatus. In detail, the inspection image of the first chip region CR1 of the photomask PM may be extracted as a first image Ima, and the inspection image of the second chip region CR2 of the photomask PM may be extracted as a second image Imb. The first and second images Ima and Imb may be optical images of the first and second chip regions CR1 and CR2 obtained by the photomask inspecting apparatus, respectively.

Each of the first and second images Ima and Imb may include image patterns IP. The image patterns IP may be optical images of the mask patterns MP of the first and second chip regions CR1 and CR2.

For example, the image patterns IP of each of the first and second images Ima and Imb may include first to fourth image patterns IP1 to IP4 extending in the first direction D1 in parallel to each other. The first to fourth image patterns IP1 to IP4 of each of the first and second images Ima and Imb may correspond to the first to fourth layout patterns PA1 to PA4 of the layout design DE, respectively. In the second image Imb, the second image pattern IP2 may include a protrusion PP protruding toward the first image pattern IP1.

Figure 9:
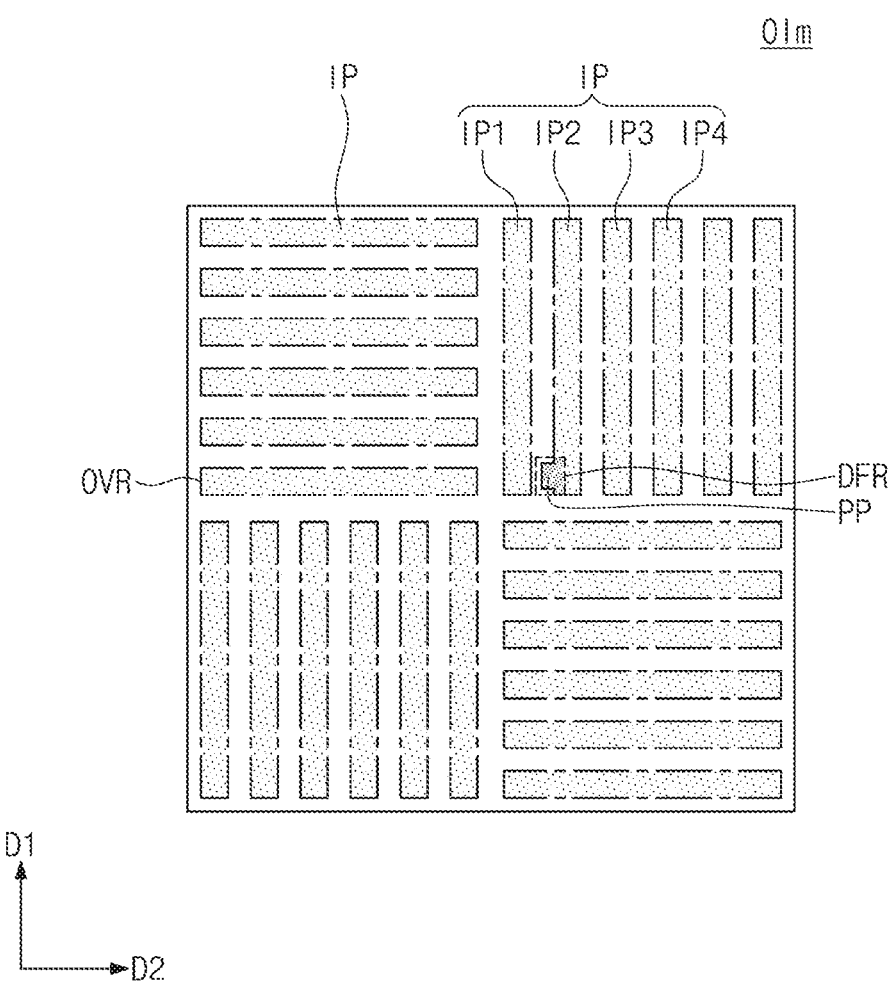
FIG. 9 illustrates an overlap image in which a first image of FIG. 7 overlaps with a second image of FIG. 8.

FIG. 9 illustrates an overlap image in which a first image of FIG. 7 overlaps with a second image of FIG. 8. Referring to FIGS. 5 and 9, the first image Ima may be compared with the second image Imb to define a difference region DFR (S320). In detail, an overlap image OIm may be obtained by overlapping the first image Ima and the second image Imb with each other, e.g., such that corresponding portions of the first image Ima and the second image Imb are aligned in plan view. The overlap image OIm may include an overlap region OVR in which the first image Ima substantially overlaps with the second image Imb, and the difference region DFR in which a difference between the first and second images Ima and Imb exists.

For example, the difference region DFR may be a region which includes the protrusion PP of the second image pattern IP2 of the second image Imb and the vicinity of the protrusion PP. Since the second image pattern IP2 of the first image Ima does not include the protrusion PP, the difference between the first and second images Ima and Imb may exist in the region including the protrusion PP.

Figure 10:
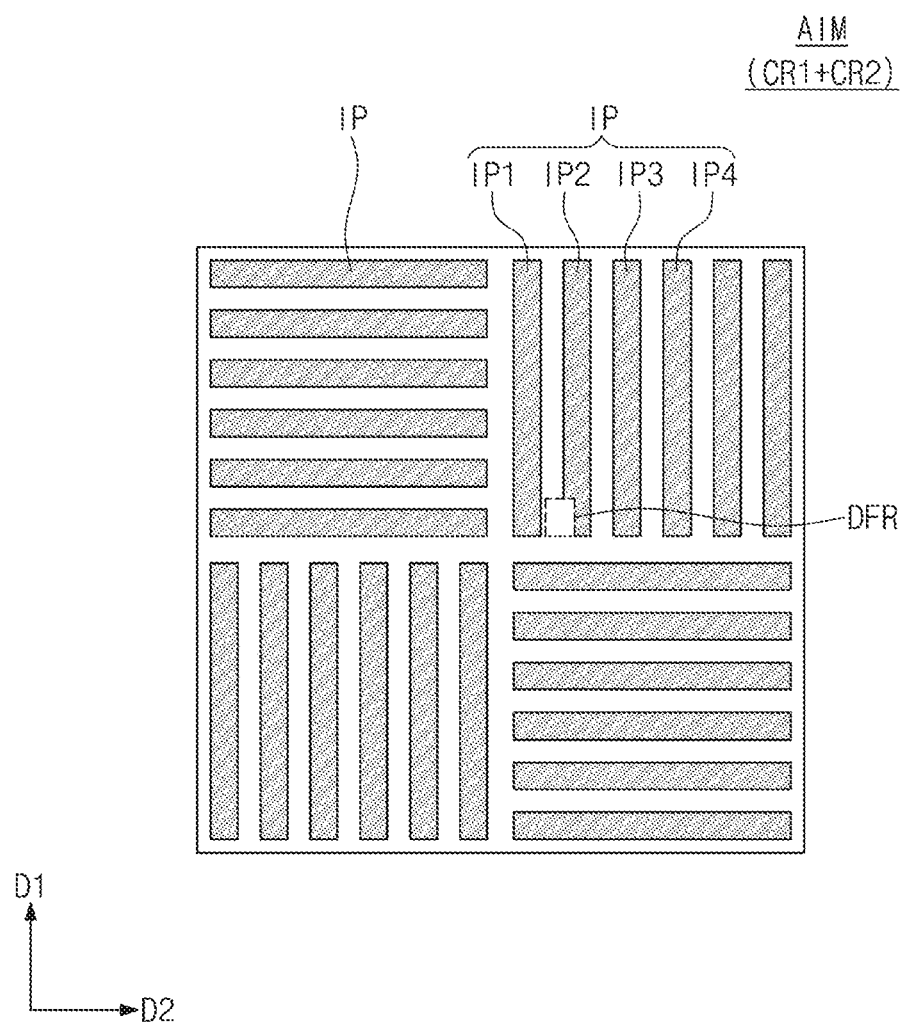
FIG. 10 illustrates a preliminary standard image obtained by averaging the first image of FIG. 7 and the second image of FIG. 8.

FIG. 10 illustrates a preliminary standard image that is generated, for example, by averaging the first image of FIG. 7 and the second image of FIG. 8. As will be understood, averaging may, in some embodiments, refer to computing an arithmetic mean of respective values for corresponding pixel positions in the first and second images. Referring to FIGS. 5 and 10, the first image Ima and the second image Imb may be averaged to form or generate a preliminary standard image AIM from which the difference region DFR is excluded (S330). For example, the formation of the preliminary standard image AIM may include averaging the first image Ima and the second image Imb to obtain an average image, and leaving the previously defined difference region DFR blank or empty in the average image, e.g., by deleting or removing portions of the preliminary standard image AIM corresponding to the difference region DFR.

Figure 11:
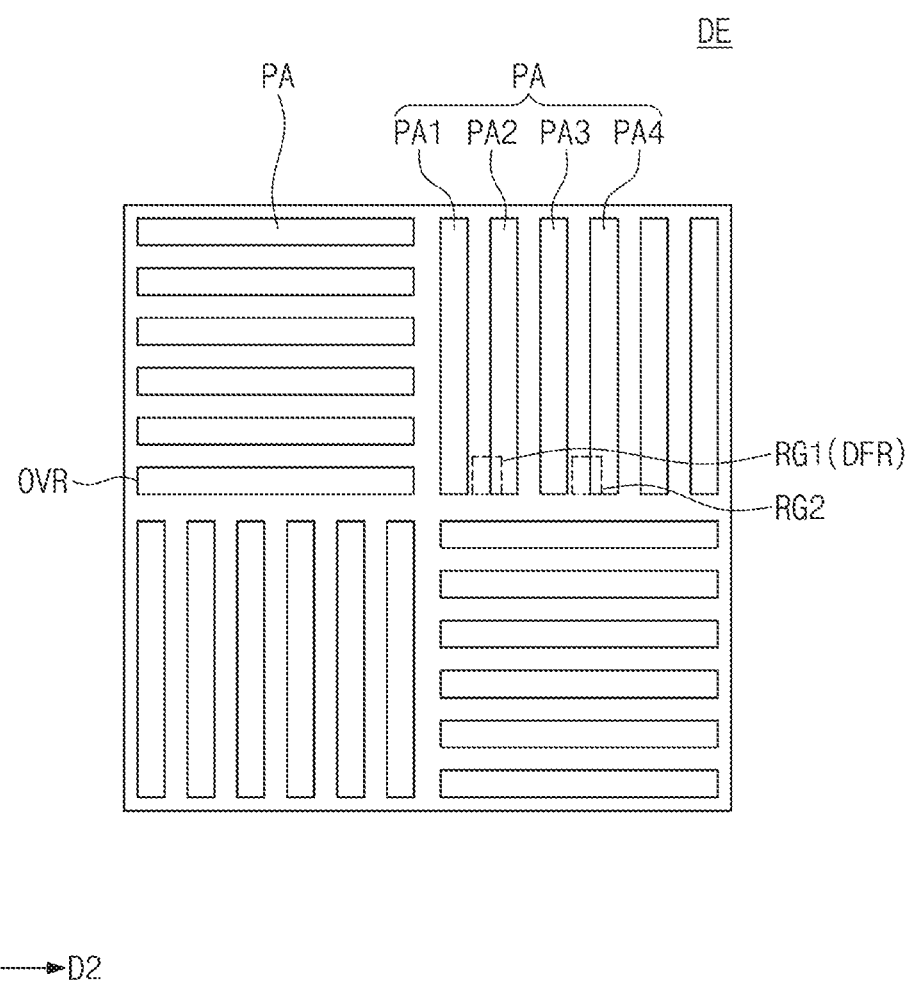
FIG. 11 is a plan view illustrating operations for defining a first region and a second region on the layout design of FIG. 6.

FIG. 11 is a plan view illustrating operations for defining a first region and a second region on the layout design of FIG. 6. Referring to FIGS. 5 and 11, a first region RG1 corresponding to the difference region DFR may be defined on the layout design DE of FIG. 6 (S340). Referring to the preliminary standard image AIM of FIG. 10, the difference region DFR may be located on the second image pattern IP2. The difference region DFR may be located between the first and second image patterns IP1 and IP2.

A region corresponding to the difference region DFR on the layout design DE may be defined as the first region RG1 on the basis of information on a size and a position of the difference region DFR (e.g., the blank region) on the preliminary standard image AIM. The first region RG1 may be located on the second layout pattern PA2. The first region RG1 may be located between the first and second layout patterns PA1 and PA2.

A second region RG2 which is substantially the same as the first region RG1 may be searched on the layout design DE (S350). For example, shapes and arrangement of the first and second layout patterns PA1 and PA2 may be substantially the same as shapes and arrangement of the third and fourth layout patterns PA3 and PA4. The second region RG2 may correspond to a region between the third and fourth layout patterns PA3 and PA4, which has the same shape as the first region RG1 defined between the first and second layout patterns PA1 and PA2.

Figure 12:
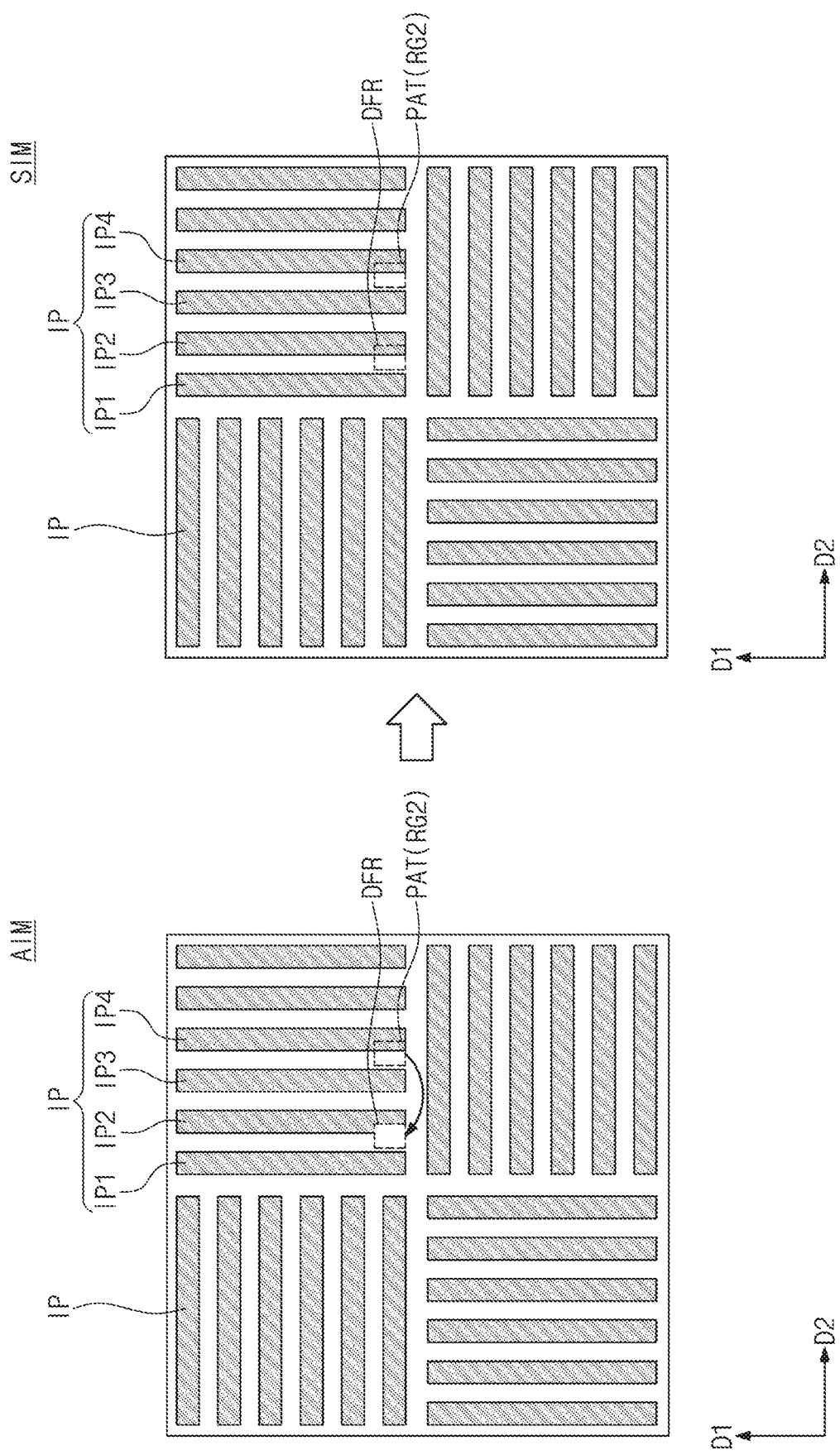
FIG. 12 is a plan view illustrating operations for forming a standard image from the preliminary standard image.

FIG. 12 is a plan view illustrating operations for forming a standard image from the preliminary standard image. Referring to FIGS. 5 and 12, a region corresponding to the second region RG2 of the layout design DE may be divided and extracted as a patch PAT from the preliminary standard image AIM (S360). For example, a region of the preliminary standard image AIM which corresponds to the second region RG2 may be extracted as the patch PAT on the basis of a size and a position of the second region RG2 of the layout design DE.

The extracted patch PAT may be inserted into the difference region DFR of the preliminary standard image AIM to form or generate a standard or reference image SIM (S370). The standard image SIM may be formed by inserting a normal image into the difference region DFR of the preliminary standard image AIM, and thus the standard image SIM may be used as a standard or reference in operations for inspecting whether each of the first to fourth chip regions CR1 to CR4 of the photomask PM is normally manufactured (e.g., has been accurately manufactured according to the design).

In other words, the normal image may be the patch PAT extracted based on the information obtained through the layout design DE. The normal image may be an optical image corresponding to the difference region DFR when the chip region of the photomask is formed without defects. As a result, when the photomask is normally manufactured from the layout design DE without defects, the standard image SIM may correspond to an optical image of the defect-free photomask.

Since the difference region DFR is the region in which the difference between the first and second images Ima and Imb exists, an appropriate image (i.e., the normal image) may be inserted into the difference region DFR of the preliminary standard image AIM to form the standard image SIM used as a standard in checking whether defects exists or not. Here, it may be necessary to search the appropriate image (i.e., the normal image). According to the present embodiments, the appropriate image (i.e., the normal image) to be inserted into the difference region DFR may be easily searched and obtained through the layout design DE used as the basis of a design of the photomask PM.

FIG. 13 is a plan view illustrating operations for comparing the standard image with the first image. Referring to FIGS. 5 and 13, the first image Ima may be compared with the standard image SIM (S380). As a result of comparing the first image Ima with the standard image SIM, the first image Ima may be substantially the same as the standard image SIM. In other words, it may be recognized that defects does not exist in the first chip region CR1.

FIG. 14 is a plan view illustrating operations for comparing the standard image with the second image. Referring to FIGS. 5 and 14, the second image Imb may be compared with the standard image SIM (S380). As a result of comparing the second image Imb with the standard image SIM, the second image pattern IP2 of the second image Imb may be different from the second image pattern IP2 of the standard image SIM. In other words, it may be recognized that defects DEF exists in the second chip region CR2 (S390). It may be recognized that the defect DEF exists on one of the mask patterns MP of the second chip region CR2 which corresponds to the second image pattern IP2, e.g., in a region or portion thereof corresponding to the difference region DFR. In addition, the defect inspection may also be performed on each of the third and fourth chip regions CR3 and CR4 by using the standard image SIM obtained above. The mask pattern MP of the second chip region CR2, on which the defect DEF exists, may be appropriately corrected to generate or manufacture a final photomask PM.

For example, an image modeling (or simulation) method may be used to obtain a standard image used as a standard of defect detection of a photomask. However, expensive apparatus and/or programs may be needed for accurate image modeling. According to embodiments of the inventive concepts, the standard or reference image SIM may be automatically obtained by comparing the first image Ima with the second image Imb, without performing operations for image modeling. In other words, the standard image SIM may be automatically generated without the use of expensive apparatus and/or programs. As a result, methods of efficiently inspecting the photomask may be performed.

While the inventive concepts have been described with reference to example embodiments, it will be apparent to those skilled in the art that various changes and modifications may be made without departing from the spirits and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A method for manufacturing a semiconductor device, the method comprising:

designing a layout;
manufacturing a photomask based on the layout;
inspecting the photomask; and
performing a photolithography process using the photomask to form a pattern on a substrate,
wherein the inspecting of the photomask comprises:
extracting a first image and a second image from a first chip region and a second chip region of the photomask, respectively;
averaging the first and second images to generate a preliminary standard image comprising a blank region;
extracting a region of the preliminary standard image as a patch; and
inserting the patch into the blank region to generate a standard image.

2. The method of claim 1, wherein the blank region corresponds to a region comprising a difference between the first and second images when the first and second images are compared with each other.

3. The method of claim 2, wherein the inspecting of the photomask further comprises:
aligning the first and second images with each other in plan view to generate an overlap image, wherein the overlap image comprises an overlap region comprising portions of the first and second images that substantially overlap with each other, and a difference region comprising the difference between the first and second images; and
removing a region of the preliminary standard image corresponding to the difference region to define the blank region.

4. The method of claim 1, wherein the extracting of the region of the preliminary standard image as the patch comprises:
defining a first region of the layout that corresponds to the blank region;
searching another region of the layout that is substantially same as the first region and defining the another region of the layout as a second region; and
extracting the region of the preliminary standard image corresponding to the second region as the patch.

5. The method of claim 1, wherein the first and second images are optical images of the first and second chip regions, respectively, and are obtained through a photomask inspecting apparatus.

6. The method of claim 1, wherein the layout comprises a first layout pattern and a second layout pattern,
wherein a shape and a size of the first layout pattern are substantially same as a shape and a size of the second layout pattern, respectively,
wherein the preliminary standard image comprises a first image pattern and a second image pattern which correspond to the first layout pattern and the second layout pattern, respectively,
wherein the blank region is located in a first region of the first image pattern, and
wherein the patch is extracted from a second region of the second image pattern.

7. The method of claim 1, wherein the inspecting of the photomask further comprises:
comparing each of the first and second images with the standard image to detect a defect in at least one of the first or second chip regions.

8. A method for manufacturing a semiconductor device, the method comprising:
designing a layout comprising a first layout pattern and a second layout pattern;
manufacturing a photomask comprising a first chip region and a second chip region based on the layout, wherein each of the first and second chip regions comprises first and second mask patterns corresponding to the first and second layout patterns, respectively;
inspecting the photomask; and
performing a photolithography process using the photomask to form a pattern on a substrate,
wherein the inspecting of the photomask comprises:
extracting first and second images from the first and second chip regions, respectively, wherein each of the first and second images comprises first and second image patterns corresponding to the first and second mask patterns, respectively;
averaging the first and second images to generate a preliminary standard image comprising a difference region, the difference region corresponding to the first image pattern;
extracting a patch corresponding to the second image pattern of the preliminary standard image; and
inserting the patch into the difference region to generate a standard image.

9. The method of claim 8, wherein the extracting of the patch comprises:
defining a first region of the first layout pattern that corresponds to the difference region;
defining a second region of the second layout pattern that is substantially same as the first region; and
extracting a region of the second image pattern of the preliminary standard image as the patch, wherein the region of the second image pattern corresponds to the second region of the second layout pattern.

10. The method of claim 8, wherein a shape and a size of the first layout pattern are substantially same as a shape and a size of the second layout pattern, respectively.

11. The method of claim 8, wherein the first and second images are optical images of the first and second chip regions, respectively, and are obtained through a photomask inspecting apparatus.

12. The method of claim 8, wherein the inspecting of the photomask further comprises:
defining the difference region comprising a difference between the first and second images by comparing the first and second images.

13. The method of claim 12, wherein the defining of the difference region comprises:
aligning the first and second images with each other in plan view to generate an overlap image, wherein the overlap image comprises:
an overlap region comprising portions of the first and second images that substantially overlap with each other; and
the difference region comprising the difference between the first and second images.

14. The method of claim 8, wherein the inspecting of the photomask further comprises:
comparing each of the first and second images with the standard image to detect a defect in at least one of the first or second chip regions.

* * * * *